(12) United States Patent
Bailey, III

(10) Patent No.: US 7,067,034 B2
(45) Date of Patent: Jun. 27, 2006

(54) METHOD AND APPARATUS FOR PLASMA FORMING INNER MAGNETIC BUCKET TO CONTROL A VOLUME OF A PLASMA

(75) Inventor: Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/536,347

(22) Filed: Mar. 27, 2000

(65) Prior Publication Data

US 2003/0047140 A1   Mar. 13, 2003

(51) Int. Cl.
*C23F 1/00* (2006.01)
*H01L 21/306* (2006.01)
*C23C 16/00* (2006.01)

(52) U.S. Cl. .......................... 156/345.49; 156/345.42; 156/345.46; 118/723 MR; 118/723 MA; 118/723 I

(58) Field of Classification Search ............ 118/723 E, 118/723 ER, 723 I, 723 IR, 723 AN, 723 MW, 118/723 ME, 723 MA, 723 MR; 156/345, 156/345.42, 345.46, 345.49; 204/298.16, 204/298.2, 298.22, 298.37
See application file for complete search history.

(56) References Cited

U.S. PATENT DOCUMENTS

| | | | |
|---|---|---|---|
| 4,948,458 A | 8/1990 | Ogle | 156/643 |
| 4,990,229 A | 2/1991 | Campbell et al. | 204/298.06 |
| 5,032,205 A | 7/1991 | Hershkowitz et al. | 156/345 |
| 5,091,049 A | 2/1992 | Campbell et al. | 156/345 |
| 5,122,251 A | 6/1992 | Campbell et al. | 204/298.06 |
| 5,192,849 A | 3/1993 | Moslehi | 219/121.43 |
| 5,280,219 A | 1/1994 | Ghanbari | 315/111.41 |
| 5,304,279 A | 4/1994 | Coultas et al. | 156/345 |
| 5,346,579 A | 9/1994 | Cook et al. | 156/345 |
| 5,370,765 A * | 12/1994 | Dandl | 118/723 MA |
| 5,399,253 A * | 3/1995 | Grunenfelder | 204/298.2 |
| 5,421,891 A | 6/1995 | Campbell et al. | 118/723 R |
| 5,429,070 A | 7/1995 | Campbell et al. | 118/723 R |
| 5,444,207 A | 8/1995 | Sekine et al. | 219/121.43 |
| 5,464,499 A | 11/1995 | Moslehi et al. | 216/71 |
| 5,518,547 A | 5/1996 | Barnes et al. | 118/723 |
| 5,587,038 A | 12/1996 | Cecchi et al. | 156/345 |
| 5,587,205 A | 12/1996 | Saito et al. | 427/553 |
| 5,660,744 A | 8/1997 | Sekine et al. | 219/121.43 |
| 5,669,975 A | 9/1997 | Ashtiani | 118/723 |

(Continued)

FOREIGN PATENT DOCUMENTS

EP    0495447 A1    7/1992

(Continued)

OTHER PUBLICATIONS

PCT International Search Report, dated Nov. 30, 2001, Application No. PCT/US01/40285.

(Continued)

*Primary Examiner*—Luz Alejandro-Mulero
(74) *Attorney, Agent, or Firm*—Beyer Weaver & Thomas LLP

(57) ABSTRACT

A plasma confinement arrangement for controlling the volume of a plasma while processing a substrate inside a process chamber includes a chamber within which a plasma is both ignited and sustained for processing. The chamber is defined at least in part by a wall and further includes a plasma confinement arrangement. The plasma confinement arrangement includes a magnetic array disposed inside of the chamber. The magnetic array has a plurality of magnetic elements that are disposed around a plasma region within the process chamber.

19 Claims, 6 Drawing Sheets

U.S. PATENT DOCUMENTS

| | | | | |
|---|---|---|---|---|
| 5,707,452 A | * | 1/1998 | Dandl | 118/723 MW |
| 5,783,102 A | | 7/1998 | Keller | 216/68 |
| 5,795,451 A | * | 8/1998 | Tan et al. | 204/298.2 |
| 6,077,384 A | * | 6/2000 | Collins et al. | 156/345.29 |
| 6,096,160 A | * | 8/2000 | Kadomura | 156/345.49 |
| 6,099,687 A | | 8/2000 | Yamazaki | 156/345 |
| 6,113,731 A | * | 9/2000 | Shan et al. | 156/345 |
| 6,153,977 A | * | 11/2000 | Taira et al. | 315/111.41 |
| 6,178,920 B1 | * | 1/2001 | Ye et al. | 118/723 I |
| 6,196,155 B1 | | 3/2001 | Setoyama et al. | 118/723 |
| 6,341,574 B1 | * | 1/2002 | Bailey et al. | 118/723 I |

FOREIGN PATENT DOCUMENTS

| | | | |
|---|---|---|---|
| EP | 0669637 A1 | | 8/1995 |
| EP | 838 843 A2 | | 4/1998 |
| JP | 7-130495 | * | 5/1995 |
| WO | WO 99/27758 | * | 6/1999 |

OTHER PUBLICATIONS

PCT International Search Report, dated Nov. 20, 2001, Application No. PCT/US01/08712.

* cited by examiner

METHOD AND APPARATUS FOR PLASMA FORMING INNER MAGNETIC BUCKET TO CONTROL A VOLUME OF A PLASMA

CROSS-REFERENCE TO RELATED CASES

This application is related to the following commonly assigned U.S. Patent Applications:

Application Ser. No. 09/439,759 entitled METHOD AND APPARATUS FOR CONTROLLING THE VOLUME OF A PLASMA, Application Ser. No. 09/439,661 entitled IMPROVED PLASMA PROCESSING SYSTEMS AND METHODS THEREFOR.

Application Ser. No. 09/470,236 entitled PLASMA PROCESSING SYSTEM WITH DYNAMIC GAS DISTRIBUTION CONTROL, Application Ser. No. 09/439,675 entitled TEMPERATURE CONTROL SYSTEM FOR PLASMA PROCESSING APPARATUS, Application Ser. No. 09/440,418 entitled METHOD AND APPARATUS FOR PRODUCING UNIFORM PROCESS RATES, Application Ser. No. 09/440,794 entitled MATERIALS AND GAS CHEMISTRIES FOR PLASMA PROCESSING SYSTEMS, Application No. 09/536,000 entitled METHOD AND APPARATUS FOR CONTROLLING THE VOLUME OF A PLASMA, filed on even date herewith Each of the above-identified patent applications is incorporated herein by reference.

BACKGROUND OF THE INVENTION

The present invention relates to apparatus and methods for processing substrates such as semiconductor substrates for use in IC fabrication or glass panels for use in flat panel display applications. More particularly, the present invention relates to controlling a plasma inside a plasma process chamber.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers such as $SiO_2$ may be formed on the surface of the substrate. Conversely, etching may be employed to selectively remove materials from predefined areas on the substrate surface. For example, etched features such as vias, contacts, or trenches may be formed in the layers of the substrate.

One particular method of plasma processing uses an inductive source to generate the plasma. FIG. 1 illustrates a prior art inductive plasma processing reactor 100 that is used for plasma processing. A typical inductive plasma processing reactor includes a chamber 102 with an antenna or inductive coil 104 disposed above a dielectric window 106. Typically, antenna 104 is operatively coupled to a first RF power source 108. Furthermore, a gas port 110 is provided within chamber 102 that is arranged for releasing gaseous source materials, e.g., the etchant source gases, into the RF-induced plasma region between dielectric window 106 and a substrate 112. Substrate 112 is introduced into chamber 102 and disposed on a chuck 114, which generally acts as a bottom electrode and is operatively coupled to a second RF power source 116. Gases can then be exhausted through an exhaust port 122 at the bottom of chamber 102.

In order to create a plasma, a process gas is input into chamber 102 through gas port 110. Power is then supplied to inductive coil 104 using first RF power source 108. The supplied RF energy passes through dielectric window 106 and a large electric field is induced inside chamber 102. The electric field accelerates the small number of electrons present inside the chamber causing them to collide with the gas molecules of the process gas. These collisions result in ionization and initiation of a discharge or plasma 118. As is well known in the art, the neutral gas molecules of the process gas when subjected to these strong electric fields lose electrons, and leave behind positively charged ions. As a result, positively charged ions, negatively charged electrons, and neutral gas molecules (and/or atoms) are contained inside the plasma 118.

Once the plasma has been formed, neutral gas molecules inside the plasma tend to be directed towards the surface of the substrate. By way of example, one of the mechanisms contributing to the presence of the neutral gas molecules at the substrate may be diffusion (i.e., the random movement of molecules inside the chamber). Thus, a layer of neutral species (e.g., neutral gas molecules) may typically be found along the surface of substrate 112. Correspondingly, when bottom electrode 114 is powered, ions tend to accelerate towards the substrate where they, in combination with neutral species, activate the etching reaction.

Plasma 118 predominantly stays in the upper region of the chamber (e.g., active region), however, portions of the plasma tend to fill the entire chamber. The plasma typically goes where it can be sustained, which is almost everywhere in the chamber. By way of example, the plasma may contact areas on the chamber wall 120 and elsewhere if there are nodes in the magnetic field(s) confining the plasma. The plasma may also be in contact with regions where plasma is not required for meeting process objectives (e.g., regions 123 below the substrate 112 and gas exhaust port 122 non-active regions).

If the plasma reaches non-active regions of the chamber wall, etch, deposition, and/or corrosion of the areas may ensue, which may lead to particle contamination inside the process chamber, i.e., by etching the area or flaking of deposited material. Accordingly, the chamber may have to be cleaned at various times during processing to prevent excessive build-ups of deposits (for example, resulting from polymer deposition on the chamber wall) and etched by-products. Cleaning disadvantageously lowers substrate throughput, and typically adds costs due to loss of production. Moreover, the lifetime of the chamber parts is typically reduced.

Additionally, plasma interaction with the chamber wall can lead to recombination of the ions in the plasma with the wall and thus a reduction in the density of the plasma in the chamber during processing. In systems using a larger gap between the substrate and the RF source, even greater plasma interaction and hence particle losses to the wall occur. To compensate for these increased losses, more power density is needed to ignite and maintain the plasma. Such increased power leads to higher electron temperatures in the plasma and, consequently, leads to potential damage of the substrate and the chamber wall as well.

Finally, in chambers using non-symmetric pumping of source gases, better control of a magnetic plasma confinement arrangement can help shape the plasma and compensate for such non-symmetric pumping.

In view of the foregoing, there are desired improved techniques and apparatuses for controlling a plasma inside a process chamber.

SUMMARY OF THE INVENTION

The invention relates, in one embodiment, to a plasma processing apparatus for processing a substrate. The apparatus includes a substantially cylindrical process chamber within which a plasma is both ignited and sustained for processing. The chamber is defined at least in part by a wall. The apparatus further includes a plasma confinement arrangement. The plasma confinement arrangement includes a magnetic array disposed inside the chamber. The magnetic array has a plurality of magnetic elements that are disposed radially and symmetrically about the axis of the process chamber. The plurality of magnetic elements is configured to produce a magnetic field.

The magnetic field establishes a containment field (a type of "magnetic wall") within the chamber. The containment field can be shifted in a preselected manner to improve operation of the substrate processing system and to reduce the damage and/or cleaning problems caused by the plasma's interaction with other elements of the processing system. Shifting of the containment field can be accomplished by moving the magnetic array. Movement may be continuous (that is, spinning or translating one or more magnet elements) or incremental (that is, periodically shifting the position of one or more magnet elements).

The invention relates, in another embodiment, to a method for processing a substrate in a process chamber using a plasma enhanced process. The method includes producing a magnetic containment field inside the wall of the process chamber with a magnetic array also situated inside the chamber wall. The method also includes creating the plasma inside the process chamber and confining the plasma within a volume defined at least by a portion of the resultant magnetic containment field. The method may also include moving one or more of the magnetic elements that make up the array.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
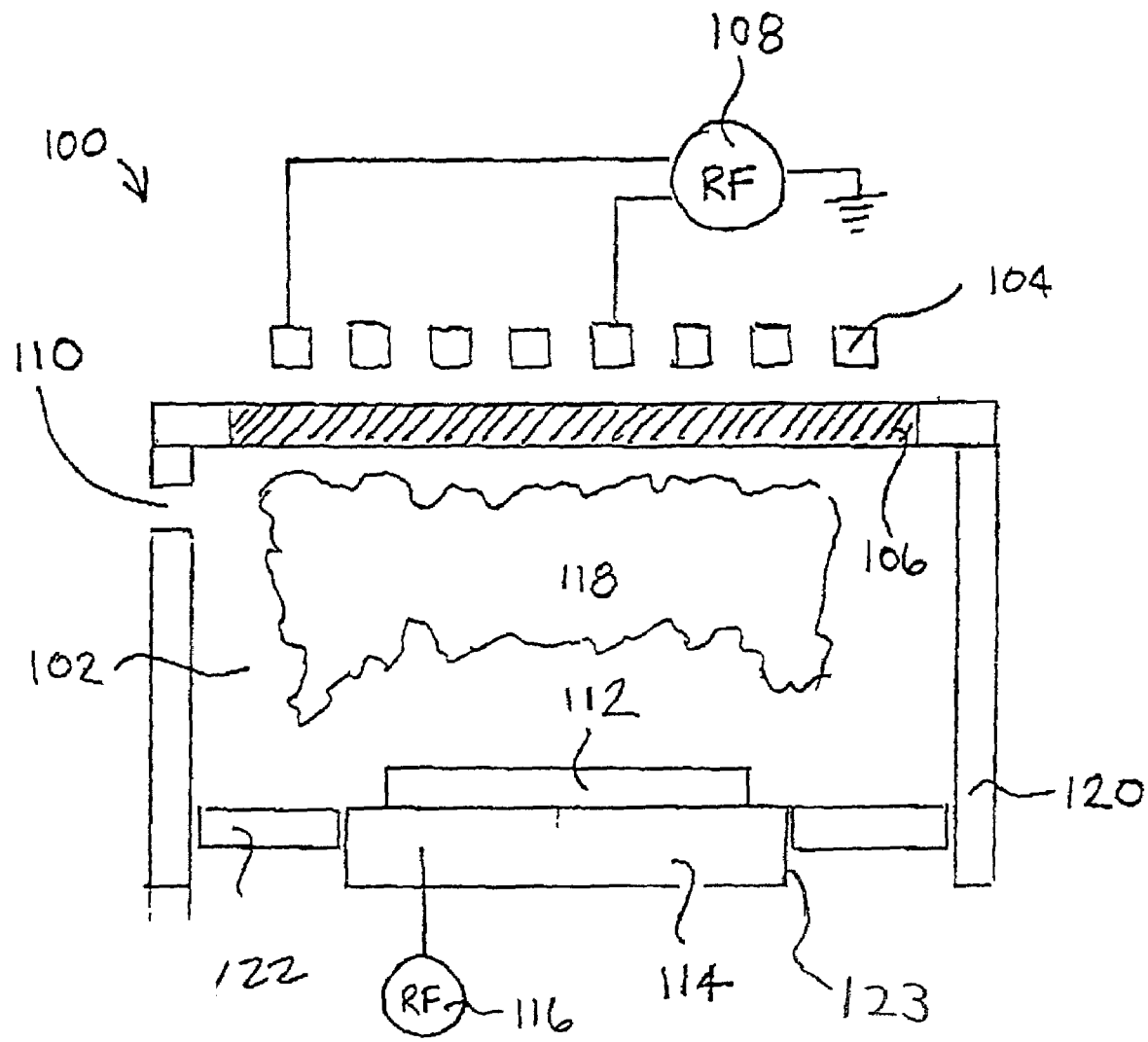
FIG. 1 illustrates a prior art inductive plasma processing reactor that is used for plasma processing.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail to avoid obscuring the present invention.

In one embodiment, the present invention provides a plasma processing apparatus for processing a substrate. The plasma processing apparatus includes a substantially cylindrical process chamber, defined at least in part by a wall, within which a plasma is both ignited and sustained for processing the substrate. The plasma processing apparatus further includes a plasma confinement arrangement being configured with a magnetic array within the chamber that produces a magnetic field. The magnetic field establishes a magnetic wall inside the wall of the chamber. By maintaining a magnetic wall inside the chamber wall, the present invention improves performance of the processing apparatus, reduces damage to the wall and reduces cleaning problems caused by interaction of the plasma and the wall. The magnetic wall also can be homogenized by continuously or incrementally moving all or part(s) of the magnetic array.

Plasma processing takes place while a substrate is disposed on a chuck within the plasma processing chamber. A process gas, which is input into a plasma processing chamber, is energized and a plasma is created. The plasma tends to fill the entire process chamber, moving to active areas and to non-active areas. In the active area(s) in contact with the plasma, the ions and electrons of the plasma are accelerated towards the area, where they, in combination with the neutral reactants at the surface of the area, react with materials disposed on the surface. These interactions are often further controlled, enhanced or modified on the substrate by the application of RF power to the substrate support to process the substrate. In the non-active areas, where little or no control is provided to optimize the possible plasma enhanced reactions, adverse processing conditions can be produced (for example, reactions with unprotected regions of the chamber such as the areas of the wall where unwanted deposition or etching of materials can take place). Ions, electrons and neutral species impinge both active and non-active areas in the reactor where they are in contact with the plasma. At the surface these fluxes interact with the surface causing etching, deposition or more typically a complicated balance of both depending on many parameters including the composition, temperature, energies of component fluxes to the surfaces. In many chemistries used for processing substrates, depositing neutral species has enhanced deposition rates on surfaces in contact with plasma bombardment. For the sake of argument and clarity we will consider these cases as typical for this invention, i.e., active areas in contact with the plasma tend to have plasma enhanced deposition while inactive areas with lower or no plasma exposure tend to have less deposition. This is not a limitation to the invention as there are other chemistries where the opposite is true and plasma exposure leads to surface erosion and less plasma leads to deposition.

The presence of the plasma in non-active areas can reduce the efficiency of the processing apparatus, cause damage to the chamber and/or give rise to cleaning problems with the chamber wall. As a result of using the present invention, the processing apparatus functions more efficiently and frequent cleaning of the wall and damage thereto can be reduced.

While not wishing to be bound by theory, it is believed that a magnetic field can be configured to influence the direction of the charged particles, e.g., negatively charged electrons or ions and positively charged ions, in the plasma. Regions of the magnetic field can be arranged to act as a mirror field where the magnetic field lines are substantially parallel to a component of the line of travel of the charged particles and where the magnetic field line density and field strength increases and temporarily captures the charged particles in the plasma (spiraling around the field lines) and eventually redirects them in a direction away from the stronger magnetic field. In addition, if a charged particle tries to cross the magnetic field, cross field forces redirect the particle's motion and tends to turn the charged particle around or inhibit diffusion across the field. In this manner, the magnetic field inhibits movement of the plasma across an area defined by the magnetic field. Generally, cross field inhibition is more effective at containing plasma than a mirror field.

Figure 2:
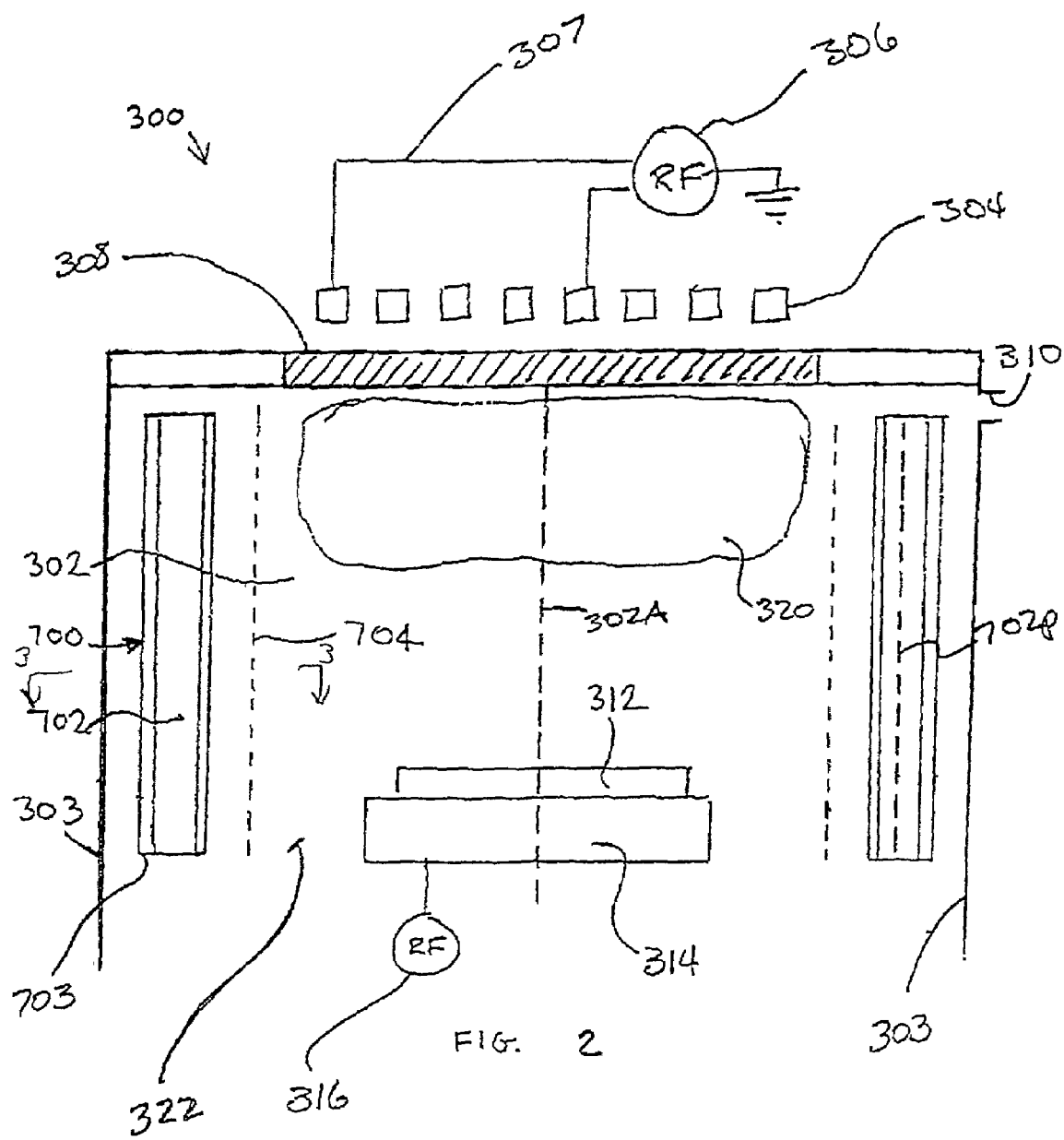
FIG. 2 shows an inductive plasma processing reactor utilizing a magnetic array, in accordance with one embodiment of the present invention.

To facilitate discussion of this aspect of the present invention, FIG. 2 illustrates an exemplary plasma processing system 300 that uses one of the aforementioned interior magnetic arrays. The exemplary plasma processing system 300 is shown as an inductively coupled plasma reactor. However, it should be noted that the present invention may be practiced in any plasma reactor that is suitable for forming a plasma, such as a capacitively coupled or an ECR reactor.

Plasma processing system 300 includes a plasma processing chamber 302, a portion of which is defined by a chamber wall 303. For ease of manufacturing and simplicity of operation, process chamber 302 preferably is configured to be substantially cylindrical in shape with a substantially vertical chamber wall 303. However, it should be noted that the present invention is not limited to such and that various configurations of the process chamber may be used.

Outside chamber 302, there is disposed an antenna arrangement 304 (represented by a coil) that is coupled to a first RF power supply 306 via a matching network 307. First RF power supply 306 is configured to supply antenna arrangement 304 with RF energy having a frequency in the range of about 0.4 MHz to about 50 MHz. Furthermore, a coupling window 308 is disposed between antenna 304 and a substrate 312. Substrate 312 represents the work-piece to be processed, which may represent, for example, a semiconductor substrate to be etched, deposited, or otherwise processed or a glass panel to be processed into a flat panel display. By way of example, an antenna/dielectric window arrangement that may be used in the exemplary plasma processing system is described in greater detail in a co-pending patent application Ser. No. 09/440,418 entitled, METHOD AND APPARATUS FOR PRODUCING UNIFORM PROCESS RATES, incorporated herein by reference.

A gas injector 310 is typically provided within chamber 302. Gas injector 310 is preferably disposed around the inner periphery of chamber 302 and is arranged for releasing gaseous source materials, e.g., the etchant source gases, into the RF-induced plasma region between coupling window 308 and substrate 312. Alternatively, the gaseous source materials also may be released from ports built into the walls of the chamber itself or through a shower head arranged in the dielectric window. By way of example, a gas distribution system that may be used in the exemplary plasma processing system is described in greater detail in a co-pending patent application Ser. No. 09/470,236 entitled, PLASMA PROCESSING SYSTEM WITH DYNAMIC GAS DISTRIBUTION CONTROL, incorporated herein by reference.

For the most part, substrate 312 is introduced into chamber 302 and disposed on a chuck 314, which is configured to hold the substrate during processing in the chamber 302. Chuck 314 may represent, for example, an ESC (electrostatic) chuck, which secures substrate 312 to the chuck's surface by electrostatic force. Typically, chuck 314 acts as a bottom electrode and is preferably biased by a second RF power source 316. Second RF power source 316 is configured to supply RF energy having a frequency range of about 0.4 MHz to about 50 MHz.

Additionally, chuck 314 is preferably arranged to be substantially cylindrical in shape and axially aligned with process chamber 302 such that the process chamber and the chuck are coaxially aligned. However, it should be noted that this is not a limitation and that chuck placement may vary according to the specific design of each plasma processing system. Chuck 314 may also be configured to move between a first position (not shown) for loading and unloading substrate 312 and a second position (not shown) for processing the substrate. An exhaust port 322 is disposed between chamber walls 303 and chuck 314 and is coupled to a turbomolecular pump (not shown), typically located outside of chamber 302. As is well known to those skilled in the art, the turbomolecular pump maintains the appropriate pressure inside chamber 302.

Furthermore, in the case of semiconductor processing, such as etch processes, a number of parameters within the processing chamber need to be tightly controlled to maintain high tolerance results. The temperature of the processing chamber is one such parameter. Since the etch tolerance (and resulting semiconductor-based device performance) can be highly sensitive to temperature fluctuations of components in the system, accurate control is required. An example of a temperature management system that may be used in the exemplary plasma processing system to achieve temperature control is described in greater detail in a co-pending patent application Ser. No. 09/439,675 entitled, TEMPERATURE CONTROL SYSTEM FOR PLASMA PROCESSING APPARATUS, incorporated herein by reference.

Additionally, another important consideration in achieving tight control over the plasma process is the material utilized for the plasma processing chamber, e.g., the interior surfaces such as the chamber wall. Yet another important consideration is the gas chemistries used to process the substrates. An example of both materials and gas chemistries that may be used in the exemplary plasma processing system are described in greater detail in a co-pending patent application Ser. No. 09/440,794 entitled, MATERIALS AND GAS CHEMISTRIES FOR PLASMA PROCESSING SYSTEMS, incorporated herein by reference.

In order to create a plasma, a process gas is input into chamber 302 through gas injector 310. Power is then supplied to antenna 304 using first RF power source 306, and a large electric field is produced inside chamber 302. The electric field accelerates the small number of electrons present inside the chamber causing them to collide with the gas molecules of the process gas. These collisions result in ionization and initiation of a discharge or plasma 320. As is well known in the art, the neutral gas molecules of the process gas, when subjected to these strong electric fields, lose electrons and leave behind positively charged ions. As a result, positively charged ions, negatively charged electrons and neutral gas molecules are contained inside plasma 320.

Once the plasma has been formed, neutral gas molecules inside the plasma tend to be directed towards the surface of the substrate. By way of example, one of the mechanisms contributing to the presence of neutral gas molecules at the substrate may be diffusion (i.e., the random movement of molecules inside the chamber). Thus, a layer of neutral species (e.g., neutral gas molecules) may typically be found along the surface of substrate 312. Correspondingly, when bottom electrode 314 is powered, ions tend to accelerate towards the substrate where they, in combination with neutral species, activate substrate processing, i.e., etching, deposition, and/or the like. The chuck 314 is spaced apart from the coupling window 308, which forms a first end of the process chamber 302. The plasma is generally ignited and sustained in a region between the window 308 and the chuck 314.

Figure 3:
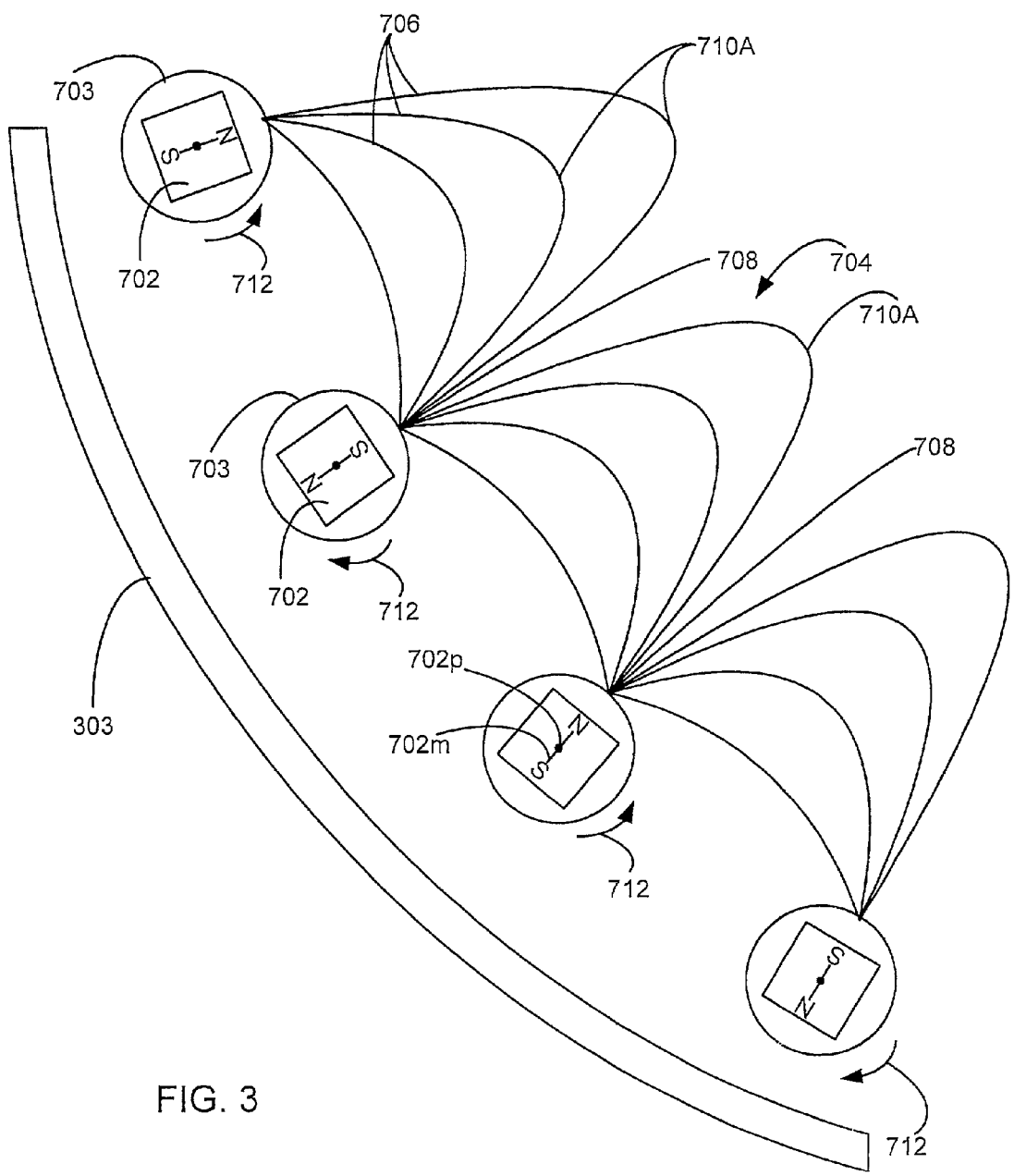
FIG. 3 is a partial cross sectional view of FIG. 2 along cut lines 3—3.

FIG. 2 shows plasma processing system 300 with a magnetic array 700 in accordance with the present invention. FIG. 3 is a partial cross sectional view of FIG. 2 along cut lines 3—3. Magnetic array 700 includes a plurality of vertical magnetic elements 702, which span substantially from the top of process chamber 302 to the bottom of process chamber 302, so that most or all of each magnetic element is disposed above the substrate 312, as shown. Radially inside of wall 303 is magnetic array 700, comprised of a plurality of magnetic elements 702, which generate a magnetic field 704. The magnetic elements 702 are vertically disposed between the top of the process chamber 302 and the chuck 314, as shown. Magnetic elements 702 are disposed radially and symmetrically about the vertical chamber axis 302A of process chamber 302 and, preferably, are axially oriented within the periphery of the process chamber 302. In the preferred embodiment, each magnetic element 702 is generally rectangular in cross-section and is an elongate bar having a number of longitudinal physical axes. An important axis is shown in the figure as 702p. Each magnetic element has a magnetic orientation defined by a north pole (N.) and a south pole (S.) connected by a magnetic axis 702m. In the preferred embodiment, the magnetic axis 702m is along the longer axis of the rectangular cross section. In the preferred embodiment, the physical axis along the elongate bar 702p and magnetic axis 702m are perpendicular in each magnetic element 702. More preferably, magnetic elements 702 are axially oriented about the periphery of the process chamber such that either of their poles (e.g., N. or S.) point toward the chamber axis 302A of process chamber 302, as shown in FIG. 3, i.e., the magnetic axes 702m are substantially in the chamber radial direction. More preferably the physical axis 702p of each magnetic element 702 is substantially parallel to the chamber axis 302A of the process chamber 302. Cusps 708 form adjacent to magnetic elements where field lines group together, i.e., the north or south ends of the magnet elements. Further still, magnetic elements 702 are spatially offset along the periphery of the process chamber such that a spacing is provided between each of the magnetic elements 702 approximately equal to the length of the rectangular cross section. It should be understood that the size of the spacing may vary according to the specific design of each plasma processing system. Preferably, the magnetic elements 702 are disposed around the region where the plasma is generally ignited and sustained between the chuck 314 and the window 308, where the magnetic elements 702 and the physical axis 702p extend along the plasma region, which is substantially from the chuck 314 to the window 308, as shown in FIGS. 2 and 3.

The performance of a magnetic confinement arrangement (sometimes referred to as a "magnetic bucket") is enhanced by situating the magnets used to generate the magnetic containment field (the "magnetic wall") inside the processing chamber 302. The convergence and resulting concentration of the field lines 706 defining field 704 create a number of nodes or cusps 708.

The total number of magnetic elements 702 is preferably equal to 32 for a chamber large enough to process 300 mm substrates. However, the actual number of magnetic elements per chamber may vary according to the specific design of each plasma processing system. In general, the number of magnetic elements should be sufficiently high to ensure that there is a strong enough plasma confining magnetic field to effectively confine the plasma. Having too few magnetic elements may create low points in the plasma confining magnetic field, which as a result may allow the plasma further access to undesired areas. However, too many magnetic elements may degrade the density enhancement because the losses are typically highest at the cusp along the field lines. As is well known to those skilled in the art, cusps form adjacent magnetic elements where field lines group together, i.e., the north or south ends of the magnet elements. Preferably, each magnetic element 702 has a relatively small cross-section, on the order of ½ to 1 inch, and is powerful, having a magnetic flux on the order of 100 to 1000 Gauss on the cusp. As will be explained in more detail below, smaller cross-sections for the magnetic elements 702 (and any coatings or protective sleeves used) reduce the surface area of the plasma containment system that can potentially be affected by the plasma during processing.

Preferably but not necessarily, the magnetic elements 702 are configured to be permanent magnets that are each about the same size and produce about the same magnetic flux. However, having the same size and magnetic flux is not a limitation, and in some configurations it may be desirable to have magnetic elements with different magnetic fluxes and sizes. By way of example, a magnetic flux of about 50 to about 1500 Gauss may be suitable for generating a plasma confining magnetic field that is sufficiently strong to inhibit the movement of the plasma. Some things that may affect the amount of flux and size of magnets needed are the gas chemistries, power, plasma density, etc. Preferably, the permanent magnets are formed from a sufficiently powerful permanent magnet material, for example, one formed from the NdFeB (Neodymium Iron Boron) or SmCo (Samarium Cobalt) families of magnetic material. In some small chambers, AlNiCo (aluminum, nickel, cobalt and iron) or ceramics may also work well.

In addition to selecting the material from which the magnetic elements 702 are made, each magnetic element 702 preferably is coated with or contained in a suitable material to insulate the magnetic material from the plasma itself. The protective material should insulate the magnetic elements 702 and be relatively easy to clean and replace, as needed. In the preferred embodiment, sleeves 703 of SiC are used to house the magnetic elements 702. Each magnetic element 702 also can be coated with SiC or SiC plates may be bonded on the magnets. Use of SiC sleeves 703, however, permits access to the magnetic material and also permits the magnet elements 702 to move within the sleeves 703, if desired. Moreover, use of sleeves 703 permits temperature control of the magnetic elements 702 by coolant fluid or other means, as appropriate.

Although permanent magnets are employed for implementing the plasma confinement arrangement, it is also possible to implement the plasma confinement arrangement using electromagnets. Electromagnets offer the advantage of controlling the amount of magnetic flux, so that better process control may be achieved. However, electromagnets may complicate the manufacturablity of the system and therefore might not be practical. As described below in more detail, electromagnets also may facilitate shifting of a magnetic field, if desired.

Again, for the most part, the strength of the magnetic flux of the magnetic elements 702 has to be high in order to have significant field strength away from the magnets. If too low of a magnetic flux is chosen, regions of low field in the plasma confining magnetic field will be larger, thus reducing the containment effectiveness of the magnetic field. Therefore, it is preferable to maximize the field. Preferably, the plasma confinement magnetic field has a magnetic field strength effective to prevent the plasma from passing through the plasma confinement magnetic field. More specifically, the plasma confinement magnetic field should have a magnetic flux in the range of about 15 to about 1500 Gauss, preferably from about 50 to about 1250 Gauss, and more preferably from about 750 to about 1000 Gauss.

In the preferred embodiment, the deposition of material on the chamber wall 303 typically will be negligible. However, to reduce damage or the frequency of cleaning required, a disposable liner may also be used between wall 303 and array 700. Such a liner can be used for a preselected number of processing cycles and later disposed of and replaced with a new liner, thus obviating the need for cleaning the chamber wall 303. The sleeves (or coated magnetic elements 702) will appear as sheaths during processing and can be cleaned using conventional chamber cleaning techniques. Again, because the affected surface area of the magnetic elements 702 is substantially smaller than the chamber walls in conventional processing chambers, less cleaning is needed.

With respect to the magnetic fields employed, it is generally preferred to have zero or near zero magnetic fields proximate to the substrate. A magnetic flux near the surface of the substrate tends to adversely affect process uniformity. Therefore, the containment field is preferably configured to produce substantially zero magnetic fields above the substrate. Also, one or more additional magnetic confinement arrays may be used adjacent the exhaust port 322 to further enhance confinement of the plasma within chamber 302. An example of an exhaust port confinement array arrangement is described in greater detail in the co-pending patent application Ser. No. 09/439,759 entitled, METHOD AND APPARATUS FOR CONTROLLING THE VOLUME OF A PLASMA, incorporated herein by reference.

In accordance with another aspect of the present invention, a plurality of flux plates also can be provided to control any stray magnetic fields produced by the magnetic elements of the plasma confinement arrangement. The flux plates are configured to short circuit the magnetic field in areas that a magnetic field is not desired, for example, the magnetic field that typically bulges out on the non-used side of the magnetic elements. Further, the flux plates redirect some of the magnetic field and therefore a more intense magnetic field may be directed in the desired area. Preferably, the flux plates minimize the strength of the magnetic field in the region of the substrate, and as a result the magnetic elements can be placed closer to the substrate. Accordingly, a zero or near zero magnetic field proximate to the surface of the substrate may be achieved.

Note that although the preferred embodiment contemplates that the magnetic field produced be sufficiently strong to confine the plasma without having to introduce a plasma screen into the chamber, it is possible to employ the present invention along with one or more plasma screens to increase plasma confinement. By way of example, the magnetic field may be used as a first means for confining the plasma and a plasma screen, typically a perforated grid in pump port 322, may be used as a secondary means for confining the plasma.

Preferably, the chamber wall 303 is formed from a non-magnetic material that is substantially resistant to a plasma environment. By way of example, wall 303 may be formed from SiC, SiN, quartz, anodized Al, boron nitride, boron carbide and the like.

Magnetic array 700 and magnetic elements 702 are configured to force a substantial number of the plasma density gradients to concentrate away from the substrate by producing a magnetic wall in the form of field 704 inside of chamber wall 303. In this manner, uniformity is further enhanced as the plasma density gradient change across substrate 312 is minimized. Process uniformity is improved to a much greater degree in the improved plasma processing system than is possible in many plasma processing systems. An example of a magnetic array arrangement close to a coupling window and antenna is described in greater detail in the co-pending patent application Ser. No. 09/439,661 entitled, IMPROVED PLASMA PROCESSING SYSTEMS AND METHODS THEREFOR, incorporated herein by reference.

A magnetic field generally inhibits ion penetration of charged particles through the part 710A of the field 704 substantially perpendicular to the line of travel of the plasma traveling to the wall 303, due to the tendency of a magnetic field to inhibit cross field diffusion of charged particles. Inhibition of cross field diffusion helps to contain plasma at such points 710A traveling towards the chamber wall 303. At points of the magnetic field that are substantially parallel to the line of travel of plasma travelling to the wall 303 are cusps 708A, where the magnetic field lines become denser. This increase in field line density causes a magnetic mirror effect, which also reflects the plasma, but which is not as effective in containing plasma cross field inhibition. Although the magnetic field 704 generated by the magnetic array 700 is illustrated as covering a specific area and depth in the chamber 302, it should be understood that placement of the plasma containment field 704 may vary. For example, the strength of the magnetic field can be selected by one of ordinary skill in the art to meet other performance criteria relating to processing of a substrate.

Figure 4:
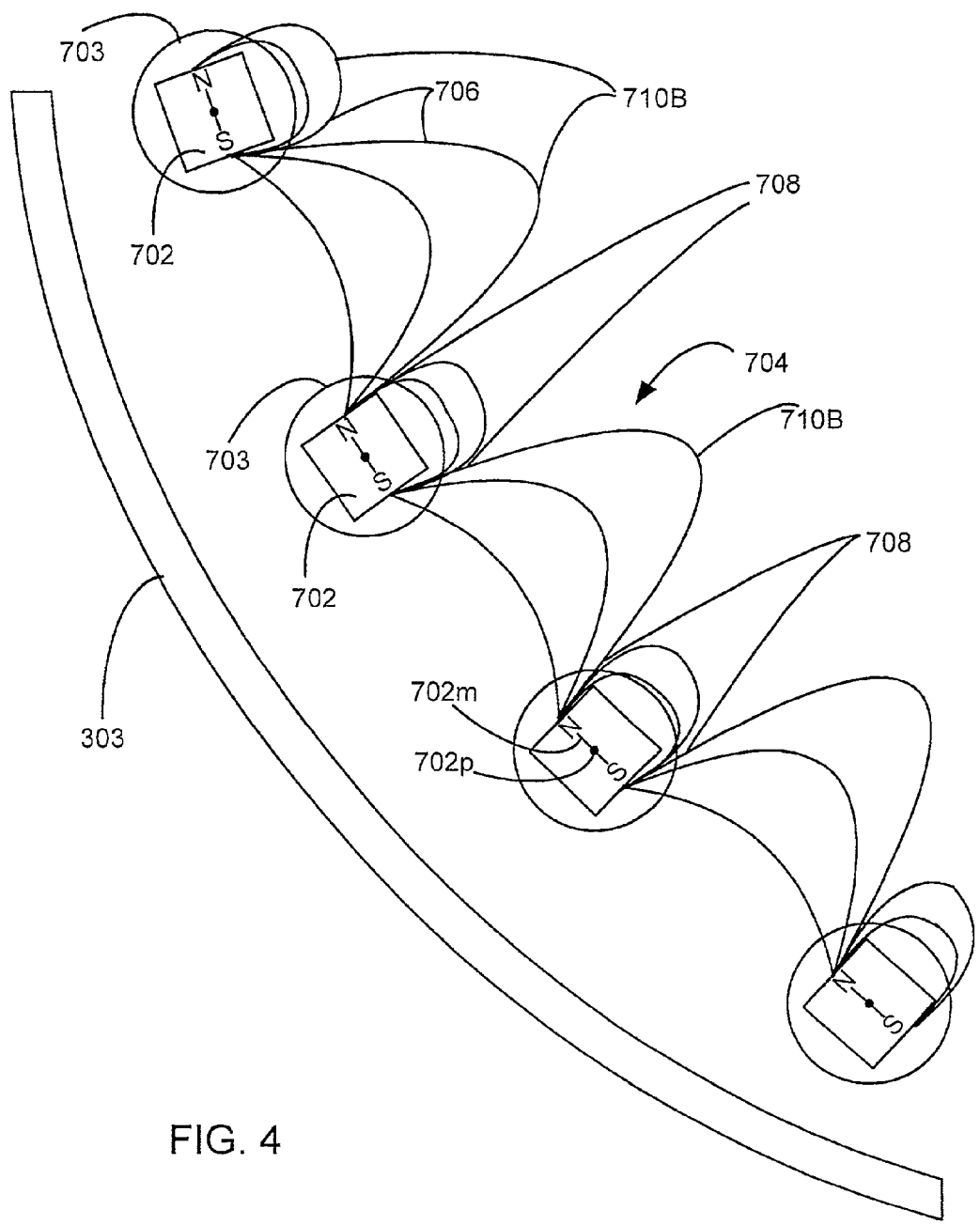
FIG. 4 is a view of the apparatus shown in FIG. 3, with the magnetic elements rotated.

The existence of cusps 708 can lead to more pronounced deposition of unwanted material on the sleeves 703. Moreover, plasma interaction with the sleeve material can lead to recombination of the ions in the plasma and thus a reduction in the density of the plasma in the chamber 302 during processing. In systems using the present invention, a shifting magnetic containment field might be helpful. An example of a non-static magnetic confinement arrangement is described in greater detail in the co-pending patent application entitled, METHOD AND APPARATUS FOR VARYING A MAGNETIC FIELD TO CONTROL A VOLUME OF A PLASMA, filed on even date herewith; incorporated herein by reference. In the present invention, individual magnetic elements 702 can be rotated within their respective sleeves 703 to mitigate the negative aspects of a static magnetic containment field. As indicated by arrows 712, every other magnetic element 702 is rotated about its physical axis 702$p$ in a clockwise manner. The remaining magnetic elements 702 are rotated in a counterclockwise manner, also indicated by arrows 712. FIG. 4 shows the altered magnetic field 704B after the magnetic elements 702 have been rotated 90°. In rotating the magnetic elements from the position in FIG. 3 to the position in FIG. 4, the cusps 708 of the magnetic field 704B shift from being near the center of the magnetic elements 702 to positions near the sides of the magnetic elements 702. This causes most of the plasma deposition to shift from locations near the center of the magnetic elements 702 to locations near the sides of the magnetic elements 702. After another 90° of rotation, the magnetic elements are again in positions similar to the positions shown in FIG. 3, wherein the magnetic elements 702 reestablish the magnetic field 704 in a position that is effectively equivalent to its starting configuration, although each magnetic element 702 has rotated 180°. The cusps 708 of the magnetic field shifts from locations near the sides of the magnetic elements 702 to the center of the magnetic elements 702, which causes most of the plasma deposition on the chamber wall 303 to shift from locations near the sides of the magnetic element 702 to locations near the center of the magnetic elements 702. The magnetic elements 702 continue to rotate until they are back in their original position shown in FIG. 3, completing a cycle. The magnetic elements 702 continue through another cycle until the plasma is extinguished. Cyclical rotation of the magnetic elements 702 causes a cyclical movement of the cusps which provides a more homogeneous containment. In the alternative the sleeves 703 may be rotated to evenly distribute plasma deposition over the entire surface of the sleeve.

A second "magnetic bucket" can be positioned (concentric to the inner magnetic array 700) outside of the chamber 302 to assist in confining a plasma. Magnetic elements of the second magnetic bucket can be placed about the outer periphery of the wall 303 to further reduce plasma deposits on the chamber wall 303.

As seen in FIG. 3, the magnetic elements in the preferred embodiment also are in an alternating polar orientation. That is, the inwardly directed pole of each consecutive magnetic element 702 alternates N-S-N-S-N-S-N-S to create the magnetic field 704. Other orientations of the magnetic elements other than the configurations shown in FIGS. 3 and 4 may be used in the practice of the invention, as long as the resulting magnetic field has an azimuthally symmetric radial gradient, in that the N-S magnetic axes 702m for all magnetic elements are not aligned all in the same direction, but instead create a plurality of cusp patterns and a minimum magnetic field at the substrate. More preferably, at some time during the rotation of the magnetic elements all magnetic axes 702m are parallel to the radii on which they lie. For example, a consistent radial polar alignment (N-N-N-N-N-N or S-S-S-S-S-S) also can be used to generate a different initial static field. Each of these magnetic orientations produces a different containment field and one of ordinary skill in the art may select the most appropriate configuration for the particular application encountered without departing from the spirit and scope of the present invention.

As can be seen from the foregoing, the present invention offers numerous advantages over the prior art. By way of example, the invention provides a more closely contained magnetic containment field that is configured for confining a plasma. In addition, the present invention presents a nearly total magnetic containment of a plasma, thereby saving wear and tear on the chamber wall and frequent cleaning of the chamber wall. Consequently, the magnetic field is more effective in substantially preventing the plasma from moving to non-active areas of the process chamber. More importantly, the plasma can be better controlled to a specific volume and a specific location inside the process chamber while increasing the gas pumping conductance consequently improving the pressure range in which the system can be operated for a given source gas flow. As the neutral distribution in the chamber is largely unaffected by the magnetic field, the outer wall 303 can be chosen to result in optimal neutral uniformity while the magnetic bucket controlling the plasma uniformity can be chosen independently. In this manner, a more uniform plasma density and neutral density is obtained, which as a result tends to produce more uniform processing, i.e., the center and the edge of the substrate having substantially the same etch rate during etching, while reducing the need for frequent cleaning and/or other upkeep of the processing chamber.

Figure 5:
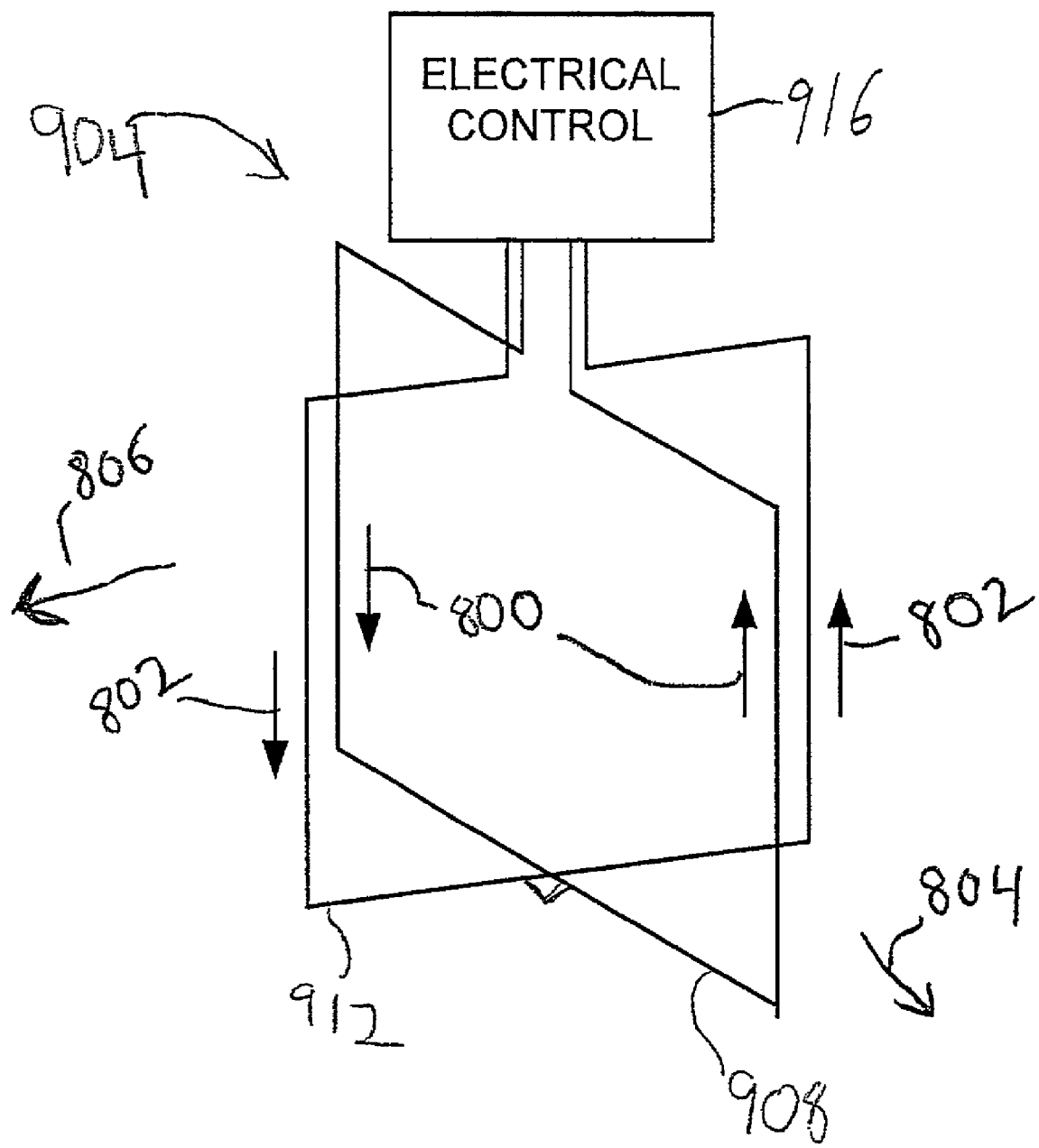
FIG. 5 is a schematic view of an electromagnet system that may be used in an embodiment of the invention.
Figure 6:
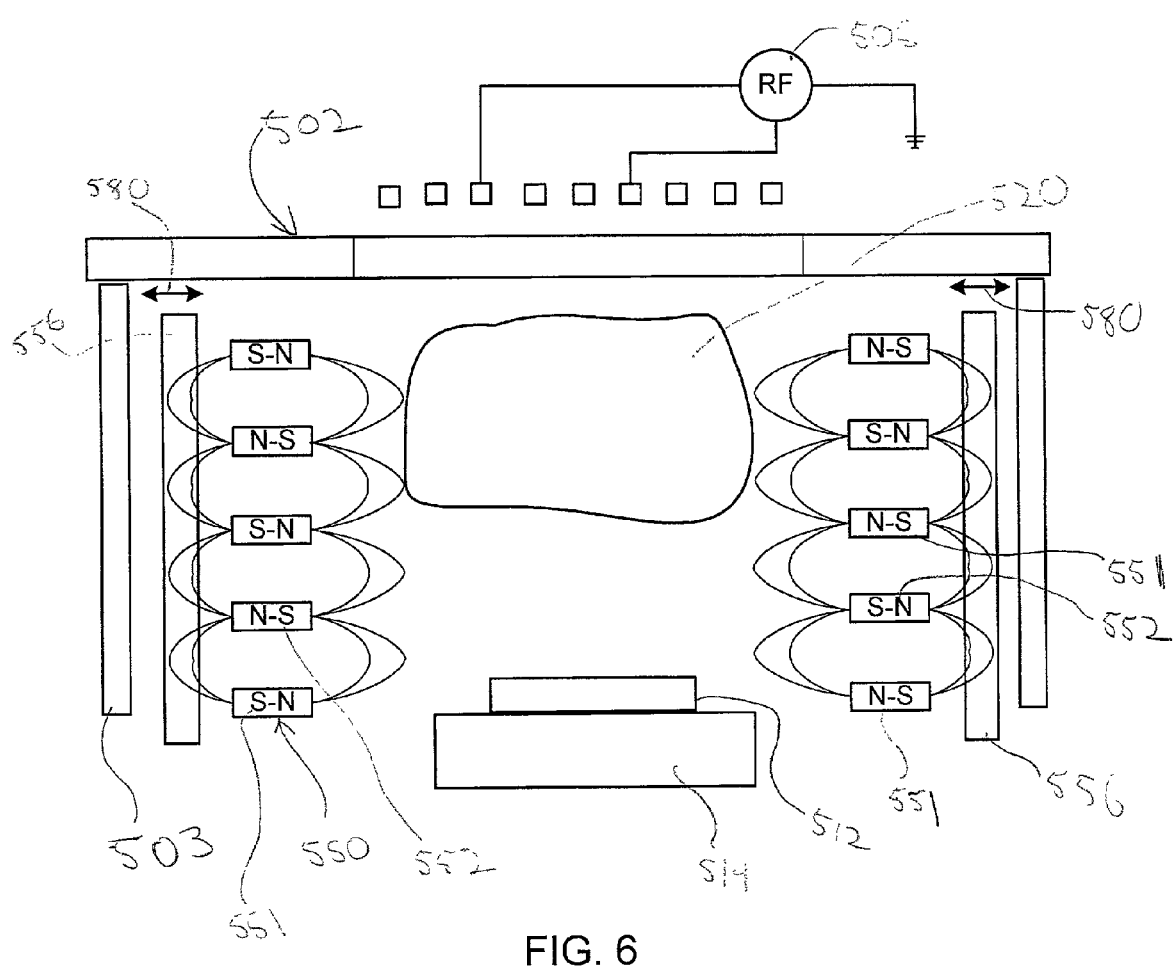
FIG. 6 is an inductive plasma processing reactor utilized in another embodiment of the invention.

FIG. 5 illustrates an electromagnet system 904, which may be used as the magnetic elements 702 in FIGS. 2–4. The electromagnetic system 904 comprises a first electromagnet 908, a second electromagnet 912, and an electrical control 916. The first and second electromagnets 908, 912 each comprise at least one current loop, with only one current loop being shown for clarity. In operation, the electrical control 916 provides a first current 800 in the first electromagnet 908 to create a first magnetic field 806 and a second current 802 in the second electromagnet 912 to create a second magnetic field 804. By having the electrical control 916 change the magnitudes and direction of the first and second currents 800, 802 over time, the sum of the resulting first and second magnetic fields 806, 804 results in the same rotating magnetic field provided by the magnetic elements 702 in FIGS. 2–4. This embodiment shows that it is possible to control movement of the magnetic field by using magnetic elements 702, which are electromagnets. Electromagnets offer the advantage of controlling the amount of magnetic flux, so that better process control may be achieved. However, electromagnets tend to further complicate the manufacturability of the system. In this embodiment of the invention, the electrical current supplied to the magnetic array 700 can control the strength and orientation of the magnetic field. Of course, electromagnetic magnetic elements 702 also could be physically manipulated in just the same way as permanent magnets to achieve the desired modulation in the magnetic field.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing apparatus for processing a substrate, comprising:
   a process chamber, comprising:
      a wall defining part of the process chamber and a plasma region;
      a gas source for providing a gas within the process chamber defined by the wall;
      a device for igniting and sustaining within the process chamber a plasma from the gas provided by the gas source for said processing; and
   a plasma confinement arrangement, comprising a magnetic array having a plurality of magnetic elements that are disposed within said process chamber, said plurality of magnetic elements being configured to produce a magnetic field, and wherein said plurality of magnetic elements are disposed around and the wall extend along said plasma region, and wherein said magnetic elements are within said plasma region, wherein the wall surrounds the magnetic elements and the plasma region so that plasma is able to form plasma deposition on the wall, and wherein the magnetic field produced by the magnetic elements reduces plasma deposition on the wall, wherein each of said plurality of magnetic elements extend substantially from a first end of said process chamber to a chuck, wherein the magnetic elements are spaced apart from the wall, so that the gas provided by the gas source is able to surround the magnetic elements and go into spaces between the wall and the magnetic elements, wherein said magnetic field has an azimuthally symmetric radial gradient.

2. The apparatus, as recited in claim 1, wherein each magnetic element has a physical axis which extends along the plasma region.

3. The apparatus, as recited in claim 2, wherein each magnetic element has a magnetic axis which is substantially perpendicular to the physical axis.

4. The apparatus, as recited in claim 2, wherein said magnetic elements are permanent magnets.

5. The apparatus, as recited in claim 2, wherein said magnetic elements are individually contained within sleeves, wherein each sleeve contains only a single magnetic element.

6. The apparatus, as recited in claim 5, wherein said sleeves shield said magnetic elements from plasma.

7. The apparatus, as recited in claim 2, wherein at least one of said magnetic elements is moved so that said magnetic field shifts over time.

8. The apparatus, as recited in claim 2, wherein said magnetic elements are rotated.

9. The apparatus, as recited in claim 1, wherein said magnetic elements are permanent magnets.

10. The apparatus, as recited in claim 1, wherein said magnetic elements are individually contained within sleeves, wherein each sleeve contains only a single magnetic element.

11. The apparatus, as recited in claim 1, wherein at least one of said magnetic elements is moved so tat said magnetic field shifts over time.

12. The apparatus, as recited in claim 1, wherein the plurality of magnetic elements are disposed around and outside the periphery of the substrate.

13. The apparatus, as recited in claim 1, wherein the magnet elements are placed to create a minimum magnetic field at the substrate.

14. The apparatus, as recited in claim 1, wherein the shape of the process chamber is substantially cylindrical and the wall forms a side of the substantially cylindrical shaped process chamber, the process chamber further comprising a substrate holder at a bottom of the substantially cylindrical shaped-process chamber wherein the wall extends from a top of the substantially cylindrical shaped-process chamber to the bottom of the substantially cylindrical shaped process chamber.

15. The apparatus, as recited in claim 14, wherein each of the plurality of magnetic elements extend substantially from the top of the substantially cylindrical shaped process chamber to the bottom of the substantially cylindrical shaped process chamber.

16. The apparatus, as recited in claim 15, further comprising a dielectric window at the top of the substantially cylindrical shaped process chamber.

17. The apparatus, as recited in claim 1, wherein each of the plurality of magnetic elements have a first end and a second end, wherein the first ends of the plurality of magnetic elements form an opening that is a magnet free opening, so that magnets do not extend across firs ends of the plurality of magnetic elements, and wherein the second ends of the plurality of magnetic elements form an opening that is a magnet free opening, so that magnets do not extend across second ends of the plurality of magnetic elements.

18. The apparatus, as recited in claim 17, further comprising a coil adjacent to the first end of the plurality of magnetic elements.

19. The apparatus, as recited in claim 1, further comprising a coil adjacent to the first ends of said process chamber.

* * * * *